United States Patent
Pabon

(10) Patent No.: US 9,353,577 B2
(45) Date of Patent: May 31, 2016

(54) MINIMIZING STICK-SLIP WHILE DRILLING

(71) Applicant: SCHLUMBERGER TECHNOLOGY CORPORATION, Sugar Land, TX (US)

(72) Inventor: Jahir Pabon, Newton, MA (US)

(73) Assignee: Schlumberger Technology Corporation, Sugar Land, TX (US)

( * ) Notice: Subject to any disclaimer, the term of this patent is extended or adjusted under 35 U.S.C. 154(b) by 286 days.

(21) Appl. No.: 14/063,926

(22) Filed: Oct. 25, 2013

(65) Prior Publication Data

US 2014/0048337 A1   Feb. 20, 2014

Related U.S. Application Data

(62) Division of application No. 11/945,589, filed on Nov. 27, 2007, now abandoned.

(51) Int. Cl.
| | | |
|---|---|---|
| *E21B 10/42* | (2006.01) | |
| *E21B 10/55* | (2006.01) | |
| *E21B 10/43* | (2006.01) | |
| *E21B 10/54* | (2006.01) | |
| *G06F 17/50* | (2006.01) | |

(52) U.S. Cl.
CPC .............. *E21B 10/43* (2013.01); *E21B 10/54* (2013.01); *G06F 17/50* (2013.01)

(58) Field of Classification Search
CPC ......... E21B 10/42; E21B 10/54; E21B 10/55; E21B 10/43
USPC ........................................................ 175/398
See application file for complete search history.

(56) References Cited

U.S. PATENT DOCUMENTS

| | | |
|---|---|---|
| 3,118,511 A | 1/1964 | Kay |
| 3,491,844 A | 1/1970 | Kelly, Jr. |
| 4,858,706 A | 8/1989 | Lebourgh |
| 4,981,184 A | 1/1991 | Knowlton et al. |
| 5,131,478 A | 7/1992 | Brett et al. |

(Continued)

FOREIGN PATENT DOCUMENTS

GB    2417967    3/2006

OTHER PUBLICATIONS

International Search Report of PCT Application No. PCT/US2008/077692 dated Oct. 8, 2009: pp. 1-4.

(Continued)

*Primary Examiner* — Kenneth L Thompson
(74) *Attorney, Agent, or Firm* — Bridget M. Laffey

(57) ABSTRACT

According to the invention, a method for designing a rotary drill bit for drilling a cavity in a medium is disclosed. The method may include determining a characteristic of a drillstring with which the rotary drill bit is coupled. The method may also include determining an initial number of groups of cutters for the rotary drill bit, where each group of cutters includes a plurality of cutters substantially aligned along a different radius of the drilling face. The method may moreover include determining a characteristic of the medium relative to a characteristic of the cutters. The method may additionally include determining a characteristic of a rotational motion source used to rotate the rotary drill bit. The method may further include determining the angles of pitch between each of the groups of cutters to minimize an amount of sticking or slipping of the bit in the medium during a drilling operation.

13 Claims, 17 Drawing Sheets

(56) References Cited

U.S. PATENT DOCUMENTS

| | | | |
|---|---|---|---|
| 5,314,033 A | 5/1994 | Tibbitts | |
| 5,595,252 A | 1/1997 | O'Hanlon | |
| 5,816,346 A | 10/1998 | Beaton | |
| 5,937,958 A | 8/1999 | Mensa-Wilmot et al. | |
| 6,062,325 A * | 5/2000 | Taylor | E21B 10/42 |
| | | | 175/378 |
| 6,298,930 B1 | 10/2001 | Sinor et al. | |
| 6,308,790 B1 | 10/2001 | Mensa-Wilmot et al. | |
| 6,349,780 B1 * | 2/2002 | Beuershausen | E21B 10/55 |
| | | | 175/408 |
| 6,460,631 B2 | 10/2002 | Dykstra et al. | |
| 6,997,271 B2 | 2/2006 | Nichols et al. | |
| 7,036,612 B1 | 5/2006 | Raymond et al. | |
| 7,703,557 B2 | 4/2010 | Durairajan et al. | |
| 8,327,956 B2 * | 12/2012 | Drews | E21B 10/43 |
| | | | 175/431 |
| 2006/0162968 A1 | 7/2006 | Durairajan et al. | |
| 2006/0180356 A1 | 8/2006 | Durairajan et al. | |
| 2009/0114453 A1 * | 5/2009 | Gavia | E21B 10/43 |
| | | | 175/425 |
| 2009/0138242 A1 | 5/2009 | Pabon | |
| 2012/0152624 A1 * | 6/2012 | Chen | E21B 10/55 |
| | | | 175/428 |

OTHER PUBLICATIONS

Jardine et al., "Putting a Damper on Drilling's Bad Vibrations," Oilfield Review, Jan. 1994: pp. 15-20.

Richard et al., "A simplified model to explore the root cause of stick-slip vibrations in drilling systems with drag bits," Journal of Sound and Vibration, 2007, vol. 305: pp. 432-456.

Wade, "Closing in on stick-slip," Australian Mining, Oct. 2007: pp. 1-4, <http://www.miningaustralia.com.au/news/closing-in-on-stick-slip>.

* cited by examiner

ROOTS OF LINEARIZED SYSTEM WITH DELAY MODEL
Bith WITH 6 BLADES

MINIMIZING STICK-SLIP WHILE DRILLING

CROSS-REFERENCE TO RELATED APPLICATION

This application is a divisional of U.S. patent application Ser. No. 11/945,589 filed Nov. 27, 2007, which is incorporated herein by reference in its entirety.

BACKGROUND OF THE INVENTION

This invention relates generally to drilling. More specifically, the invention relates to cutter placement on a drill bit to minimize stick-slip occurrences.

Drill bits, particularly Polycrystalline Diamond Composite (PDC) drill bits commonly used for drilling earthen formations, typically exhibit blades of cutters that are nearly uniformly distributed around the bit axis of rotation. The cutters on the face of such drill bits will therefore evenly share the cutting load of the medium into which they are applied. In theory, by equally distributing the cutting load onto all cutters, the life of the drill bit should be maximized, with all bits wearing evenly until the end of their useful life.

However, such a symmetric drill bit may experience sticking and slipping of the drill bit in the medium when the drill bit either "bites" too much or too little of the medium to cause further boring into the medium. When the drill bit bites too much of the medium, each of the symmetrically cutters is engaging too much medium without enough torque to cause the medium to either be sheared or otherwise removed from the cavity. When the drill bit bites too little of the medium, the path of least resistance for the drill bits may be to skip over the medium rather than remove material from the cavity. Rippling caused by each symmetric cutter on the face of the bore hole may also result in each cutter arriving at the same time at the location of a ripple left by the previous cutter on the drill bit. This may happen repeatedly as the drill bit rotates against the face of the bore hole, causing both stick and slip conditions. Both stick and slip occurrences will cause torsional vibrations in the drillstring connecting the drill bit to drill's rotational power source.

Furthermore, because the drill bit is being urged into the medium during drilling, axial vibrations may occur from the drill bit being forced into a medium it is not actually cutting (sticking) or retreating from the medium, albeit slightly, when it is slipping. These torsional and axial vibrations can reduce the life of the drill bit and associated drilling equipment such as the rotational power source.

BRIEF DESCRIPTION OF THE INVENTION

In one embodiment, a rotary drill bit for drilling a cavity in a medium is provided. The rotary drill bit may include a bit body and a plurality of cutters coupled with a drilling face of the bit body. The bit body may include a distal end having the drilling face, and a proximal end having a rotational power source coupling mechanism. The plurality of cutters is coupled with the drilling face of the bit body and includes a plurality of groups of cutters. Each group of cutters is substantially aligned along a different radius of the drilling face. The azimuthal distribution of said groups of cutters is non-symmetric around the axis of the drilling face.

Advantageously, the plurality of cutter may include at least six groups of cutters and the radius along which the second group of cutters may be substantially aligned may be substantially a first angle (A) in pitch from the radius along which the first group of cutters may be substantially aligned. The radius along which the third group of cutters may be substantially aligned may be substantially the first angle (A) minus a second angle (θ), (A−θ), in pitch from the radius along which the second group of cutters may be substantially aligned. The radius along which the fourth group of cutters may be substantially aligned may be substantially the first angle (A) plus the second angle (θ), (A+θ), in pitch from the radius along which the second group of cutters may be substantially aligned. The radius along which the fifth group of cutters may be substantially aligned may be substantially the first angle (A) in pitch from the radius along which the fourth group of cutters may be substantially aligned. The radius along which the sixth group of cutters may be substantially aligned may be substantially the first angle (A) minus two times the second angle (θ), (A−2×θ), degrees in pitch from the radius along which the fifth group of cutters may be substantially aligned. The second angle θ may be substantially greater than zero degrees.

Advantageously, the plurality of cutter may include at least eight groups of cutters and the radius along which the second group of cutters may be substantially aligned may be substantially a first angle (A) in pitch from the radius along which the first group of cutters may be substantially aligned. The radius along which the third group of cutters may be substantially aligned may be substantially the first angle (A) minus a second angle (θ), (A−θ), in pitch from the radius along which the second group of cutters may be substantially aligned. The radius along which the fourth group of cutters may be substantially aligned may be substantially the first angle (A) in pitch from the radius along which the third group of cutters may be substantially aligned. The radius along which the fifth group of cutters may be substantially aligned may be substantially the first angle (A) plus the second angle (θ), (A+θ), in pitch from the radius along which the fourth group of cutters may be substantially aligned. The radius along which the sixth group of cutters may be substantially aligned in may be substantially the first angle (A) in pitch from the radius along which the fifth group of cutters may be substantially aligned. The radius along which the seventh group of cutters may be substantially aligned may be substantially the first angle (A) minus two times the second angle (θ), (A−2×θ), degrees in pitch from the radius along which the sixth group of cutters may be substantially aligned. The radius along which the eighth group of cutters may be substantially aligned may be the first angle (A) in pitch from the radius along which the seventh group of cutters may be substantially aligned. The second angle θ may be substantially greater than zero degree.

In another embodiment, a method for designing a rotary drill bit for drilling a cavity in a medium is provided. The method may include determining a characteristic of a drillstring with which the rotary drill bit is coupled. The method may also include determining an initial number of groups of cutters for the rotary drill bit, where each group of cutters includes a plurality of cutters substantially aligned along a different radius of the drilling face. The method may moreover include determining a characteristic of the medium relative to a characteristic of the cutters. The method may additionally include determining a characteristic of a rotational motion source used to rotate the rotary drill bit. The method may further include determining the angles of pitch between each of the groups of cutters to minimize an amount of sticking or slipping of the rotary drill bit in the medium during a drilling operation.

BRIEF DESCRIPTION OF THE DRAWINGS

The present invention is described in conjunction with the appended figures.

Figure 1A:
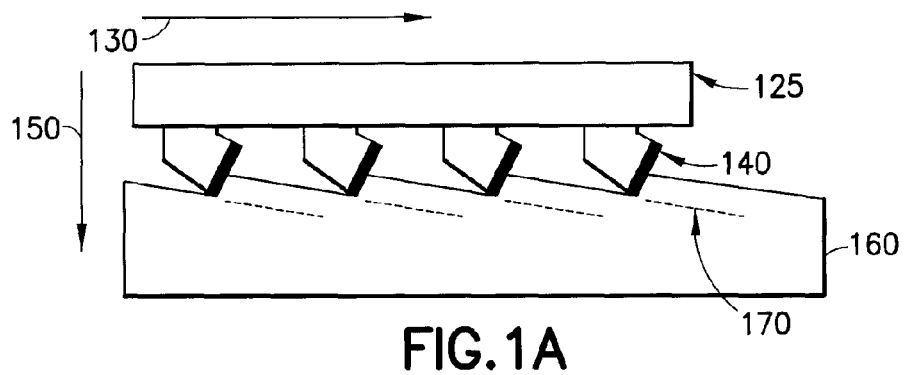
FIG. 1A is a side view of the cutters of a symmetrical circular drill bit, shown linearly with respect to the curvature of the drill bit for explanatory purposes only, as the drill bit cuts through a medium.

In the appended figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION OF THE INVENTION

The ensuing description provides exemplary embodiments only, and is not intended to limit the scope, applicability or configuration of the disclosure. Rather, the ensuing description of the exemplary embodiments will provide those skilled in the art with an enabling description for implementing one or more exemplary embodiments. It being understood that various changes may be made in the function and arrangement of elements without departing from the spirit and scope of the invention as set forth in the appended claims.

Specific details are given in the following description to provide a thorough understanding of the embodiments. However, it will be understood by one of ordinary skill in the art that the embodiments may be practiced without these specific details. For example, systems, processes, and other elements in the invention may be shown as components in block diagram form in order not to obscure the embodiments in unnecessary detail. In other instances, well-known processes, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but could have additional steps not discussed or included in a figure. Furthermore, not all operations in any particularly described process may occur in all embodiments. A process may correspond to a method, a function, a procedure, a subroutine, a subprogram, etc. When a process corresponds to a function, its termination corresponds to a return of the function to the calling function or the main function.

Furthermore, embodiments of the invention may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In one embodiment of the invention, a rotary drill bit for drilling a cavity in a medium is provided. The medium may be any material, and in some embodiments may be an earthen formation. The rotary drill bit may include a bit body and a plurality of cutters coupled with a drilling face of the bit body. The bit body may include a distal end having the drilling face, and a proximal end having a rotational power source coupling mechanism. The plurality of cutters may be coupled with the drilling face of the bit body, and may include a plurality of groups of cutters. Each group of cutters may be substantially aligned along a different radius of the drilling face. The different groups of cutters may be non-symmetrically aligned on the drilling face. For the purposes of this disclosure, the phrases "groups of cutters," "cutting blades," and/or "blades of cutters" may be used interchangeably, and may refer to groups of cutters substantially aligned along a different radius of the drilling face.

By non-symmetrically aligning the different group of cutters around the axis of the drilling face, moreover the overall torque of the system may be applied by fewer number of cutters when some slippage occurs. As the rotary drill bit is urged downward, this will cause more powerful reengagement of a lesser number of cutters to occur prior to a complete revolution of the rotary drill bit. Thus, rather than all of the cutters implementing the same amount of torque that caused a slippage, fewer cutters will engage due to the non-symmetrical nature of the drill face, but will engage at higher levels of torque, causing drilling to continue.

FIGS. 1A-1D show an example of a drill bit 125 with symmetrically aligned cutters 140 cutting through a medium. In FIGS. 2A-2D, cutters 140 on a circular drill bit 125 are shown linearly with respect to the curvature of drill bit 125 for explanatory purposes only. In FIG. 1A, directional arrow 130 shows the direction of spin of the cutters 140. Directional arrow 150 shows the direction of axial penetration into the medium 160. Dashed lines 170 show the anticipated path of cutters 140 through medium 160 if the rate of drill bit rotation and rate of penetration remain constant.

Figure 1B:
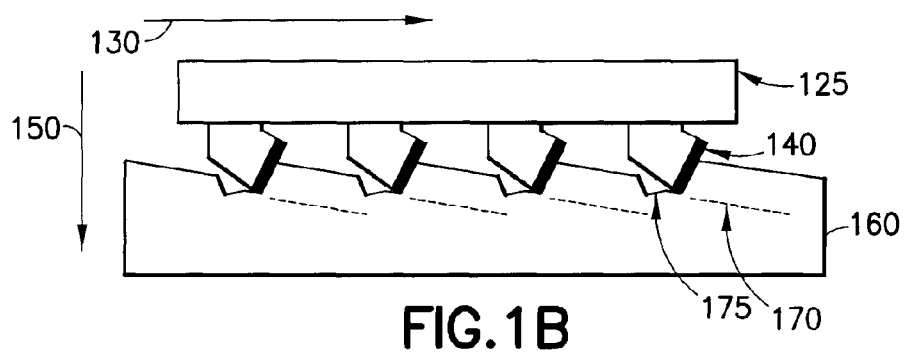
FIG. 1B is a side view the same drill bit shown in FIG. 2A, except incrementally later in the drilling process, after a ripple has been caused in the drilling process.

FIG. 1B is a side view of drill bit 125 shown in FIG. 1A, except incrementally later in the drilling process, after a ripple 175 has been caused in the drilling process. Ripple may have been cause by drill bit 125 pressing too hard into the medium, and temporarily slowing down rotationally, thereby causing each cutter 140 to leave a ripple 175 in its path.

Figure 1C:
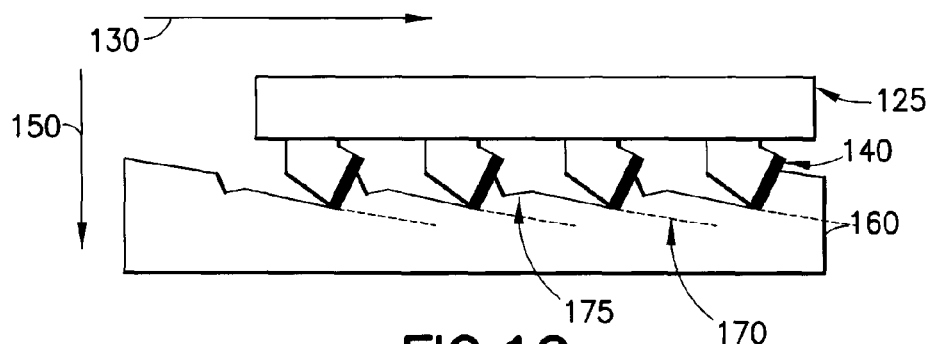
FIG. 1C is a side view the same drill bit shown in FIG. 2B, except incrementally later in the drilling process, after the ripple is first being encountered by the cutters during rotation.

FIG. 1C is a side view of drill bit 125 shown in FIG. 1B, except incrementally later in the drilling process, after ripple 175 is first being encountered by the evenly spaced cutters 140 during rotation. As is shown, all of cutters 140 have encountered the ripple 175 at the same time. This results in a transient decrease in the amount of medium to be cut, speeding up drill bit 125 temporarily.

Figure 1D:
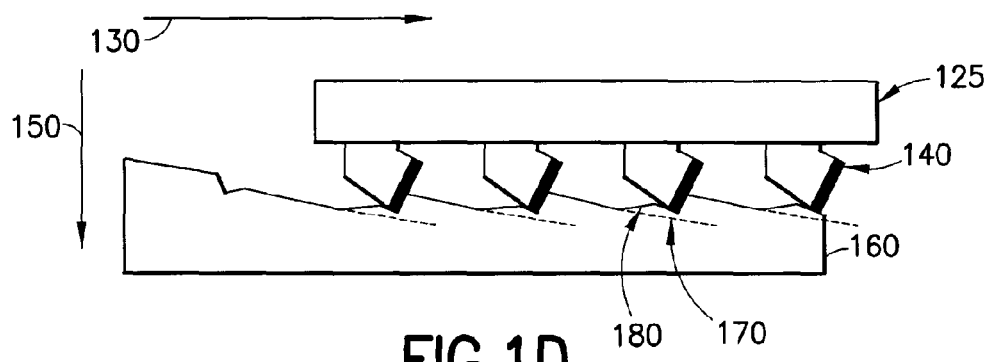
FIG. 1D is a side view the same drill bit shown in FIG. 2C, except incrementally later in the drilling process, after another ripple is created.

FIG. 1D is a side view of drill bit 125 shown in FIG. 1C, except incrementally later in the drilling process, after another ripple 180 is created. The transient speed of drill bit 125 as it encountered the previous ripple 175 has caused a new ripple 180 to be created. This process of ripple creation may thus repeat as each set of ripples is again each encountered by an evenly spaced cutter 140. The size of successive ripples may, under some circumstances grow and cause a stick slip condition.

Through embodiments of the invention, by un-evenly spacing the cutters on a drill bit face, each cutter may arrive at different times at the location of a ripple left by the previous cutter on the drill bit. The tendency of an unsymmetrical drill bit to speed up or slowdown may be reduced since only one cutter at a time may encounter a ripple, rather than all cutters on a symmetric bit encountering all ripples at the same time, over and over again as the drill bit rotates through the medium.

Figure 2A:
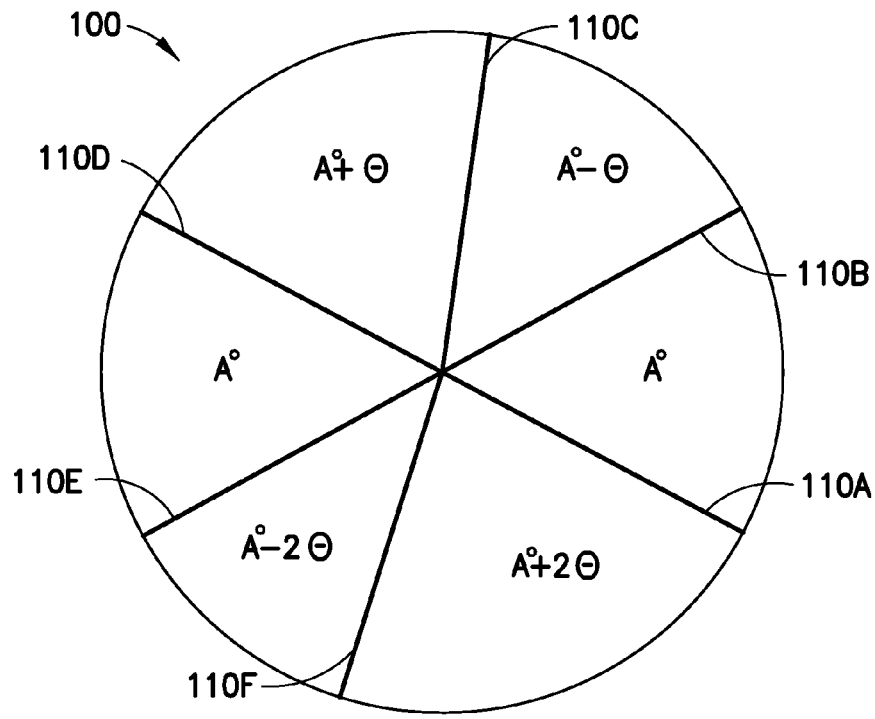
FIG. 2A is a representation of a drill face with six groups of cutters non-symmetrically aligned.

Merely by way of example, in FIG. 2A, a representation of a drill face 100 with groups of cutters 110 non-symmetrically aligned is shown. In the embodiment of FIG. 2A, six groups of cutters are represented, referenced respectively 110A to 110F. The first group of cutters 110A may lie on a particular radius. The radius along which the second group of cutters 110B may be substantially aligned may be substantially a first angle A in pitch from the radius along which the first group of cutters may be substantially aligned 110A. In the example of FIG. 1, the first angle A may be 60 degrees. The radius along which the third group of cutters 110C may be substantially aligned may be substantially the first angle (A) minus a second angle $\theta$, (A−$\theta$), or (60−$\theta$) degrees in pitch from the radius along which the second group of cutters 110B may be substantially aligned. The radius along which the fourth group of cutters 110D may be substantially aligned may be substantially angle of (A+$\theta$) or (60+$\theta$) degrees in pitch from the radius along which the third group of cutters 110C may be substantially aligned. The radius along which the fifth group of cutters 110E may be substantially aligned may be substantially first angle A in pitch from the radius along which the fourth group of cutters 110D may be substantially aligned. The radius along which the sixth group of cutters 110F may be substantially aligned may be substantially angle of (A−2$\theta$) or (60−2$\theta$) degrees in pitch from the radius along which the fifth group of cutters 110 E may be substantially aligned.

Figure 2B:
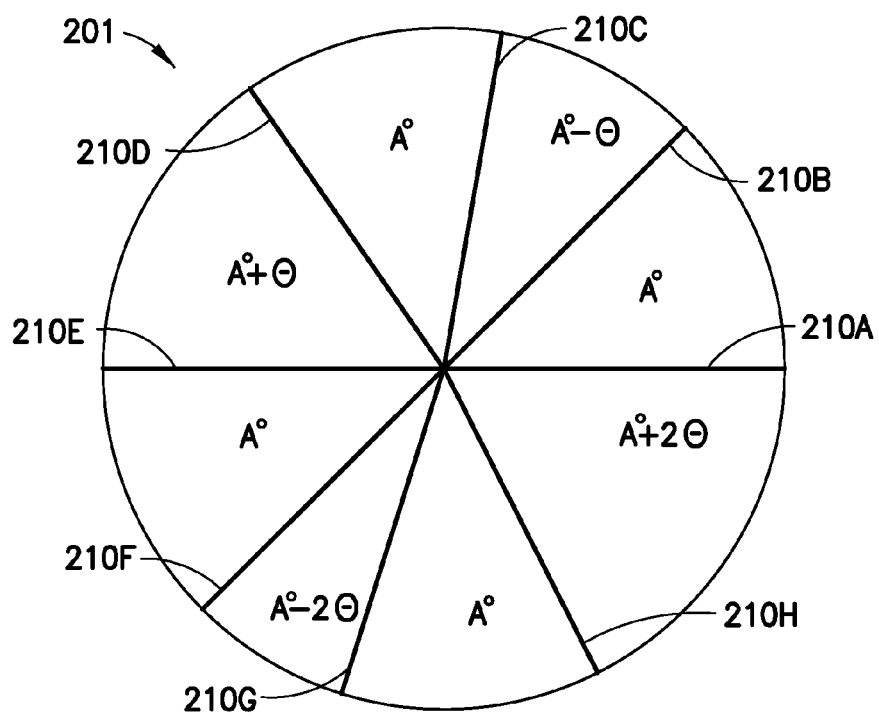
FIG. 2B is a representation of a drill face with eight groups of cutters non-symmetrically aligned.

In another example, as shown in FIG. 2B, a representation of another drill face 201 with non-symmetrically aligned cutters 210 is shown. In the embodiment of FIG. 2B, eight groups of cutters are represented, referenced respectively 210A to 210H. The first group of cutters 210A may like on a particular radius. In the example of FIG. 2B, the first angle A may be 45 degrees. The radius along which the second group of cutters 210B may be substantially aligned may be substantially 45 degrees in pitch from the radius along which the first group of cutters may be substantially aligned 210A. The radius along which the third group of cutters 210C may be substantially aligned may be substantially (45−$\theta$) degrees in pitch from the radius along which the second group of cutters 210B may be substantially aligned. The radius along which the fourth group of cutters 210D may be substantially aligned may be substantially the angle A, 45 degrees, in pitch from the radius along which the third group of cutters 210C may be substantially aligned. The radius along which the fifth group of cutters 210E may be substantially aligned may be substantially (45+$\theta$) degrees in pitch from the radius along which the fourth group of cutters 210D may be substantially aligned. The radius along which the sixth group of cutters 210F may be substantially aligned in may be substantially 45 degrees in pitch from the radius along which the fifth group of cutters 210E may be substantially aligned. The radius along which the seventh group of cutters 210G may be substantially aligned may be substantially (45−2$\theta$) degrees in pitch from the radius along which the sixth group of cutters 210E may be substantially aligned. The radius along which the eighth group of cutters 210H may be substantially aligned may be the angle A or 45 degrees in pitch from the radius along which the seventh group of cutters 210G may be substantially aligned.

In some embodiments, $\theta$ may be substantially greater than zero. Merely by way of example, in the example shown in FIG. 2A, the second angle $\theta$ may be five degrees, ten degrees, fifteen degrees, or twenty degrees. In the example shown in FIG. 2B, the second angle $\theta$ may, merely by way of example, be five degrees, ten degrees, or fifteen degrees.

Figure 3:
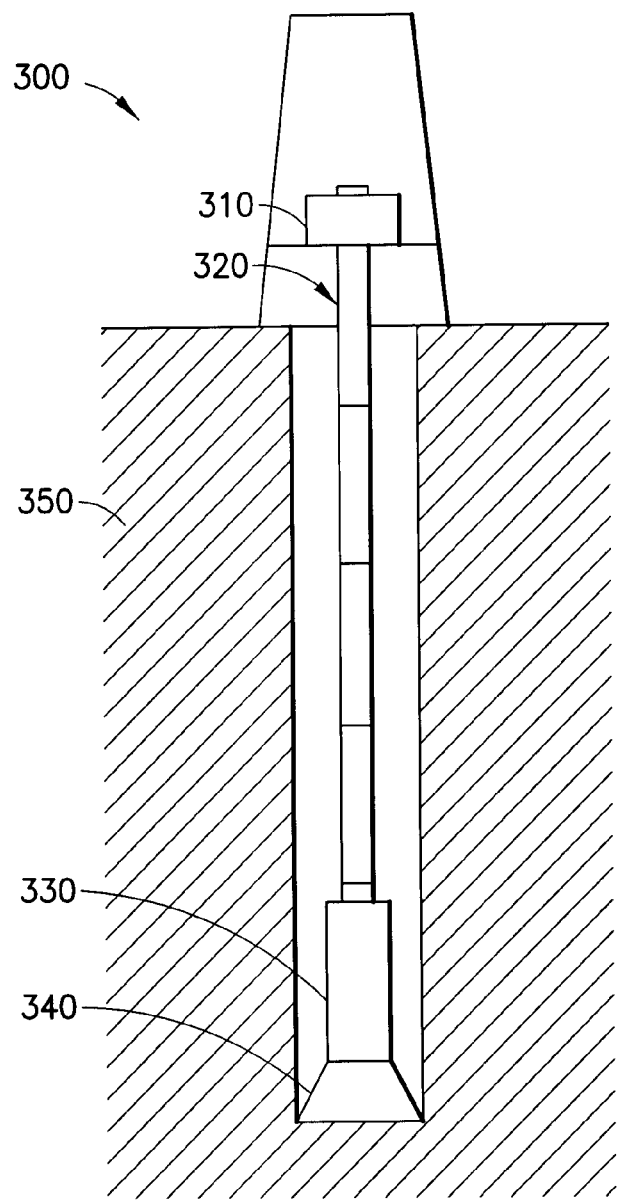
FIG. 3 is a graphical representation of a typical drilling system for the purposes of simulation.

In some embodiments, the second angle $\theta$ may be determined in an iterative manner based at least in part on any one or more of the following: the characteristics of a bottom hole assembly ("BHA") coupled with the bit body, the characteristics of a lengthwise element coupling the BHA with a rotational motion source, the characteristics of the interaction between the rotary drill bit and the medium, and the characteristics of the rotational motion source. FIG. 3 shows a graphical representation of such a drilling system 300. System 300 may include a rotational motion source 310, a lengthwise element 320 coupling motion source 310 to a bottom hole assembly ("BHA") 330, and a drill bit head 340 coupled therewith. In FIG. 3, a cavity in medium 350 is being excavated by system 300. In this embodiment, lengthwise element 320 is shown as multiple segments of drill pipe, though in other embodiments, drill tube or other connective elements could also be used.

In some embodiments, the second angle θ may be selected and/or determined to maximize a rate of progress ("ROP") of the rotary drill bit in the medium. In these or other embodiments, the second angle θ may also be selected to minimize a sticking and/or a slipping of the rotary drill bit in the medium during a drilling operation.

Mathematical constructs are discussed below which are capable of determining whether a given configuration of exemplary system 300 is stable, and therefore subject to a lessened number of stick-slip occurrences during drilling operations. These constructs may be employed in methods of the invention for designing a rotary bit for drilling cavities in mediums. These methods may determine pertinent drilling system characteristics and then apply of the principles discussed below to both select the number of cutters on the designed rotary drill, and the pitch angles between the cutters.

In some embodiments, characteristics of rotational motion source 310 may include:

$$F_T = \text{Top force}$$

$$T_T = \text{Top drive torque} = T_{st} - \frac{T_{st}}{\omega_{free}}\omega$$

$$T_{st} = \text{Stall torque of top drive motor}$$

$$\omega_{free} = \text{No load rotational speed of top drive motor}$$

Figure 4:
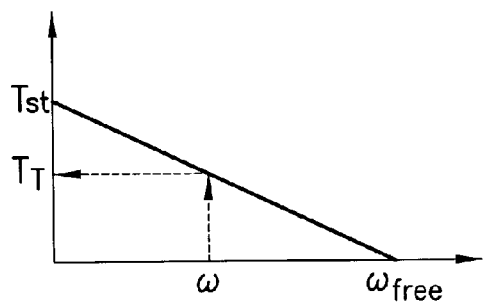
FIG. 4 is a typical representation of angular velocity versus torque for a rotational motion source.

A typical representation of torque versus angular velocity is shown in FIG. 4. In some embodiments, additional control hardware and software may be included at the surface, and may be aimed at reducing the stick/slip tendencies of the drilling tool, for instance by regulating the applied torque. In these or other embodiments, that control may act only after the stick/slip condition downhole is severe enough to reach the surface. Such an additional control may work either independent or in tandem with the systems and methods discussed herein.

In some embodiments, characteristics of lengthwise element 320 may include:
m=pipe mass=$\rho_p L_p (D_{po}^2 - D_{pi}^2)\pi/4$
$I_p$=pipe rotational inertia=$\rho_p L_p (D_{po}^4 - D_{pi}^4)\pi/32$
$K_z$=pipe extensional spring constant=$E_p (D_{po}^2 - D_{pi}^2)\pi/(4L_p)$
$K_\theta$=pipe rotational spring constant=$G_p (D_{po}^4 - D_{pi}^4)\pi/(32L_p)$
$b_{vp}$=pipe axial drag coefficient
$b_{\omega p}$=pipe rotational drag coefficient
n=Number of pipe sections (total pipe length=$nL_p$)

Figure 5:
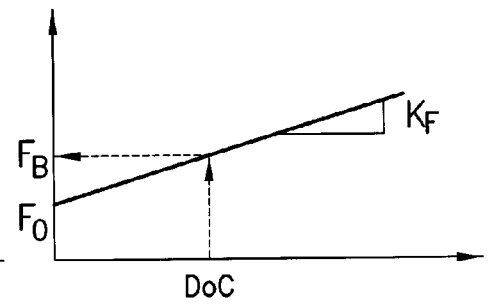
FIG. 5 is a typical representation of force versus depth of cut for the interaction between a rotary drill bit and a drilling medium.
Figure 6:
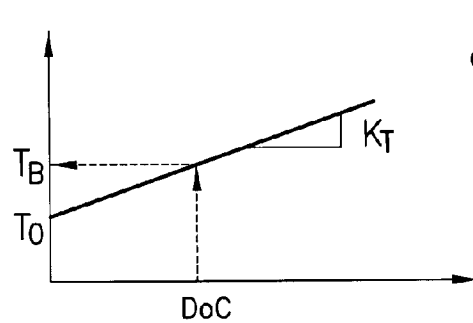
FIG. 6 is a typical representation of torque versus depth of cut for the interaction between a rotary drill bit and a drilling medium.

In some embodiments, characteristics of BHA 330 may include:
$m_B$=BHA mass=$\rho_B L_B (D_{Bo}^2 - D_{Bi}^2)\pi/4$
$I_B$=BHA rotational inertia=$\rho_B L_B (D_{Bo}^4 - D_{Bi}^4)\pi/32$
$b_{vB}$=BHA axial drag coefficient
$b_{\omega B}$=BHA rotational drag coefficient In some embodiments, characteristics of the interaction between the rotary drill bit 340 and the medium 350 may include:
$F_B$=Reaction force at the bit=$F_0 + K_F DoC$
$T_B$=Reaction torque at the bit=$T_0 + K_T DoC$ Depth of Cut ("DoC") may be the axial distance traveled by the bit per revolution, and may typically be specified in millimeters per revolution (mm/rev). A typical representation of force versus DoC is shown in FIG. 5. A typical representation of torque versus DoC is shown in FIG. 6.

The linear position of lengthwise element 320 may be described as $z_1$. The linear velocity of lengthwise element 320 may be described as $v_1$. The angular position of lengthwise element 320 may be described as $\theta_1$. The angular velocity of lengthwise element 320 may be described as $\omega_1$. Note that these descriptions assume one continuous lengthwise element 320. Multiple lengthwise elements in series may be described by multiple state variables, each having a progressively higher subscript.

The equations of motion for system 300 may be, $$\frac{1}{2}I_p\ddot{\theta}_1 + \frac{1}{2}b_{\omega p}\dot{\theta}_1 + K_\theta(\theta_1 - \theta_2) = T_T = T_{st} - \frac{T_{st}}{\omega_{free}}\dot{\theta}_1$$

$$I_p\ddot{\theta}_2 + b_{\omega p}\dot{\theta}_2 + K_\theta(2\theta_2 - \theta_1 - \theta_3) = 0$$

$$\vdots$$

$$\left(\frac{1}{2}I_p + I_B\right)\ddot{\theta}_b + \left(\frac{1}{2}b_{\omega p} + b_{\omega B}\right)\dot{\theta}_b + K_\theta(\theta_b - \theta_n) = T_B = -(T_0 + K_T DoC)$$

$$\left(\frac{1}{2}m_p + m_B\right)\ddot{z}_b + \left(\frac{1}{2}b_{vp} + b_{vB}\right)\dot{z}_b + K_z(z_b - z_n) = F_B = -(F_0 + K_F DoC)$$

$$\vdots$$

$$m_p\ddot{z}_2 + b_{vp}\dot{z}_2 + K_z(2z_2 - z_3 - z_1) = 0$$

$$\frac{1}{2}m_p\ddot{z}_1 + \frac{1}{2}b_{vp}\dot{z}_1 + K_z(z_1 - z_2) = F_T$$

$$DoC = n_b(z_b(t) - z_b(t-\tau))$$

τ may be a time delay which represents the time it takes to turn the rotary drill bit by an angle $(2\pi)/n_b$, where $n_b$ may be equal to the number of cutting blades on the rotary drill bit.

These equations do not explicitly include the effects of gravity. Gravity may generate an offset (the buoyant weight of the tool) between the force applied at the top (Hook Load) and the actual force pushing the bit against the rock (Weight On Bit, or WOB). However, apart from having the offset in top force, the development presented here may apply equally when gravity is considered.

Additionally, these equations primarily consider just axial movement and rotation around the axis of movement. While this has been done to simplify the analytical development, the stick/slip minimization technique proposed herein may still apply to more complex drilling conditions, for example, directional drilling.

In a stationary condition, at equilibrium, $$\ddot{\theta}_{1\ldots n} = \ddot{\theta}_b = \ddot{z}_{1\ldots n} = \ddot{z}_b = 0$$

$$\dot{\theta}_{1\ldots n} = \dot{\theta}_b = \omega_0$$

$$\dot{z}_{1\ldots n} = \dot{z}_b = v_0$$

$$DoC = 2\pi v_0 / \omega_0$$

Consequently, $$\left(T_{st} - \frac{T_{st}}{\omega_{free}}\omega_0\right) = b_\omega \omega_0 + (T_0 + \hat{K}_T v_0 / \omega_0)$$

$$F_T = b_v v_0 + (F_0 + \hat{K}_F v_0 / \omega_0)$$

and, $$\left(\frac{T_{st}}{\omega_{free}} + b_\omega\right)\omega_0^2 + \left[\frac{\hat{K}_F\left(\frac{T_{st}}{\omega_{free}} + b_\omega\right)}{b_v} - (T_{st} - T_0)\right]\omega_0 + \frac{\hat{K}_T(F_T - F_0) - \hat{K}_F(T_{st} - T_0)}{b_v} = 0$$

-continued $$v_0 = \frac{F_T - F_0}{b_v + \hat{K}_F/\omega_0}$$

These last two equations may give the steady state values for the bit angular rotation speed, $\omega_0$, and axial drilling speed or Rate Of Penetration (ROP), $v_0$.

In these equations, $b_\omega = nb_{\omega p} + b_{\omega b}$,
$b_v = nb_{vp} + b_{vb}$
$\hat{K}_T = 2\pi K_T$,
$\hat{K}_F = 2\pi K_F$ As an example scenario, the following characteristics of system 300 will be considered in an example application: a top drive 310 with a $T_{st}$=10 KNm and a $\omega_{free}$=300 rpm; a lengthwise element 320 with a 3.5" outer diameter, 2.5" inner diameter, which is 10000 ft long in one sectional piece, $b_v$=0.5 N/m/(m/s), $b_w$=0.05 Nm/m/(rad/s); a BHA with a 4.75" outer diameter, 2.5" inner diameter, which is 200 ft long, $b_v$=1 N/m/(m/s), $b_w$=0.1 Nm/m/(rad/s); a rotary drill bit with a 6" diameter and six cutting blades; and characteristics of the interaction between the rotary drill bit and the medium of $F_0$=800 N, $K_F$=7400 N/(mm/rev), and $T_0$=20 N, $K_T$=640 N/(mm/rev).

Figure 8:
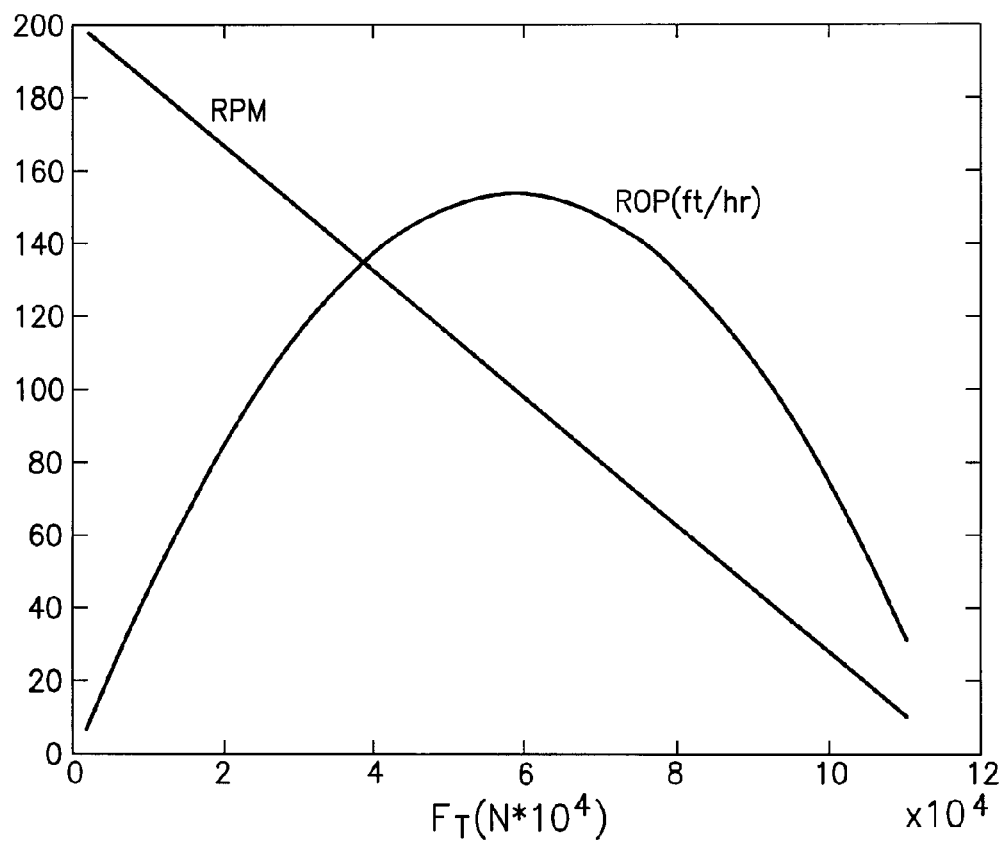
FIG. 8 is a typical representation of rate of progress and rotations per minute versus weight on bit for "hard" rock.

Given the scenario above, FIG. 8 plots the steady state values of axial drilling speed (ROP given in ft/hr) and angular rotation speed (in RPM), as a function of the applied top force. Clearly a maximal drilling speed may be achieved with an applied force of about 60 KN. However, computer simulations may reveal that the dynamic behavior of drilling under such condition is unstable. In fact, the system may still be unstable even under a lower force of 40 KN, as observed in the RPM and ROP at the bit and at the surface presented in FIG. 9.

A study of the dynamic stability of the system may be required in order to understand the observed behavior. Therefore, the Laplace Transform approach may be employed as follows.

Using the differential form of the DoC expression to account for variability of time delay ($\tau$), $$DoC(t) = z_b(t) - z_b(t-\tau)$$

$$\frac{dDoC(t)}{dt} = \dot{z}_b(t) - \dot{z}_b(t-\tau)\left(1 - \frac{d\tau}{dt}\right) \text{ with } \int_{t-\tau}^{t} \omega_b(\xi)d\xi = 2\pi/n$$

it may be determined that, $$\omega_b(t)dt = \omega_b(t-\tau)(dt - d\tau)$$

$$\Rightarrow \frac{d\tau}{dt} = 1 - \frac{\omega_b(t)}{\omega_b(t-\tau)}$$

Figure 7:
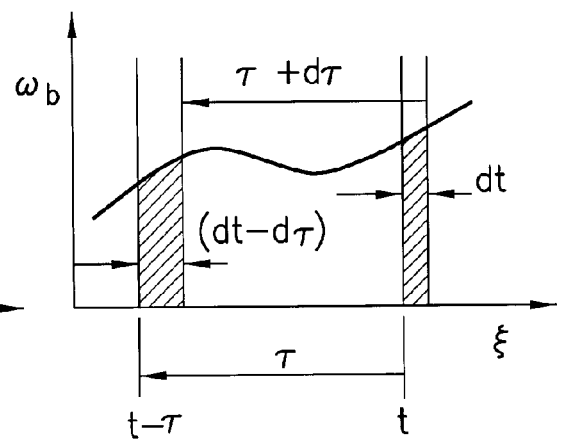
FIG. 7 is a graphical representation of the differential form of a mathematical depth of cut expression.

A graphical representation of this equation is shown in FIG. 7. Thus, $$\frac{dDoC(t)}{dt} = \dot{z}_b(t) - \dot{z}_b(t-\tau)\frac{\omega_b(t)}{\omega_b(t-\tau)}$$

Linearized around the equilibrium state, and using the Laplace Transformation representation, $$\frac{dDoC(t)}{dt} = \dot{z}_b(t) - \dot{z}_b(t-\tau_0) - \frac{v_0}{\omega_0}(\omega_b(t) - \omega_b(t-\tau_0)) \text{ with } \tau_0 = 2\pi/n_b\omega_0$$

$$sDoC = sz_b(1 - e^{-\tau_0 s}) - \frac{v_0}{\omega_0}s\theta_b(1 - e^{-\tau_0 s})$$

$$DoC = (1 - e^{-\tau_0 s})\left(z_b - \frac{v_0}{\omega_0}\theta_b\right)$$

Inserting the above value for DoC back into the equations of motion for system 300, and using the Laplace Transform representation, $$\left(\frac{1}{2}I_p s^2 + \frac{1}{2}b_{\omega p}s + K_\theta\right)\theta_1 - K_\theta \theta_2 = T_T = T_{st} - \frac{T_{st}}{\omega_{free}}s\theta_1$$

$$-K_\theta \theta_1 + (I_p s^2 + b_{\omega p}s + 2K_\theta)\theta_2 - K_\theta \theta_3 = 0$$

$$\vdots$$

$$-K_\theta \theta_n + \left(\left(\frac{1}{2}I_p + I_B\right)s^2 + \left(\frac{1}{2}b_{\omega p} + b_{\omega B}\right)s + K_\theta\right)\theta_b =$$

$$T_B = -\left(T_0 + K_T n_b(1 - e^{-\tau_0 s})\left(z_b - \frac{v_0}{\omega_0}\theta_b\right)\right)$$

$$\left(\left(\frac{1}{2}m_p + m_B\right)s^2 + \left(\frac{1}{2}b_{vp} + b_{vB}\right)s + K_z\right)z_b - K_z z_n =$$

$$F_B = -\left(F_0 + K_F n_b(1 - e^{-\tau_0 s})\left(z_b - \frac{v_0}{\omega_0}\theta_b\right)\right)$$

$$\vdots$$

$$-K_z z_3 + (m_p s^2 + b_{vp}s + 2K_z)z_2 - K_z z_1 = 0$$

$$-K_z z_2 + \left(\frac{1}{2}m_p s^2 + \frac{1}{2}b_{vp}s + K_z\right)z_1 = F_T$$

In matrix notation, this becomes, $$[A(s)]\begin{bmatrix}\theta_1\\ \theta_2\\ \vdots\\ \theta_n\\ \theta_b\\ z_b\\ z_n\\ \vdots\\ z_2\\ z_1\end{bmatrix} =$$

$$\begin{bmatrix}T_T\\ 0\\ \vdots\\ 0\\ T_B\\ F_B\\ 0\\ \vdots\\ 0\\ F_T\end{bmatrix} = \begin{bmatrix}T_{st} - \frac{T_{st}}{\omega_{free}}s\theta_1\\ 0\\ \vdots\\ 0\\ -\left(T_0 + K_T(1 - e^{-\tau_0 s})\left(z_b - \frac{v_0}{\omega_0}\theta_b\right)\right)_0\\ -\left(F_0 + K_F(1 - e^{-\tau_0 s})\left(z_b - \frac{v_0}{\omega_0}\theta_b\right)\right)\\ 0\\ \vdots\\ 0\\ F_T\end{bmatrix} = [B(s)]\begin{bmatrix}\theta_1\\ \theta_2\\ \vdots\\ \theta_n\\ \theta_b\\ z_b\\ z_n\\ \vdots\\ z_2\\ z_1\end{bmatrix} = \begin{bmatrix}T_T\\ 0\\ \vdots\\ 0\\ -T_0\\ -F_0\\ 0\\ \vdots\\ 0\\ F_T\end{bmatrix}$$

Thus, $$A(1, 1) = \frac{1}{2}I_p s^2 + \frac{1}{2}b_{\omega p} s + K_\theta$$

$$A(i, i+1) = A(i+1, i) = -K_\theta, i = 1, n$$

$$A(i, i) = I_p s^2 + b_{\omega p} s + 2K_\theta, i = 2, n$$

$$A(n+1, n+1) = \left(\frac{1}{2}I_p + I_B\right)s^2 + \left(\frac{1}{2}b_{\omega p} + b_{\omega B}\right)s + K_\theta$$

$$A(n+2, n+2) = \left(\frac{1}{2}m_p + m_B\right)s^2 + \left(\frac{1}{2}b_{vp} + b_{vB}\right)s + K_z$$

$$A(i, i+1) = A(i+1, i) = -K_z, i = n+2, 2n+1$$

$$A(i, i) = m_p s^2 + b_{vp} s + 2K_z, i = n+3, 2n+1$$

$$A(2n+2, 2n+2) = \frac{1}{2}m_p s^2 + \frac{1}{2}b_{vp} s + K_z$$

$$B(1, 1) = -\frac{T_{st}}{\omega_{free}} s$$

$$B(n+1, n+1) = K_T(1 - e^{-\tau_0 s})\frac{v_0}{\omega_0}$$

$$B(n+1, n+2) = -K_T(1 - e^{-\tau_0 s})$$

$$B(n+2, n+1) = K_F(1 - e^{-\tau_0 s})\frac{v_0}{\omega_0}$$

$$B(n+2, n+2) = -K_F(1 - e^{-\tau_0 s})$$

Therefore, the stability of system 300 may be determined by the roots of, $$\det[A(s) - B(s)] = 0$$

Figure 9:
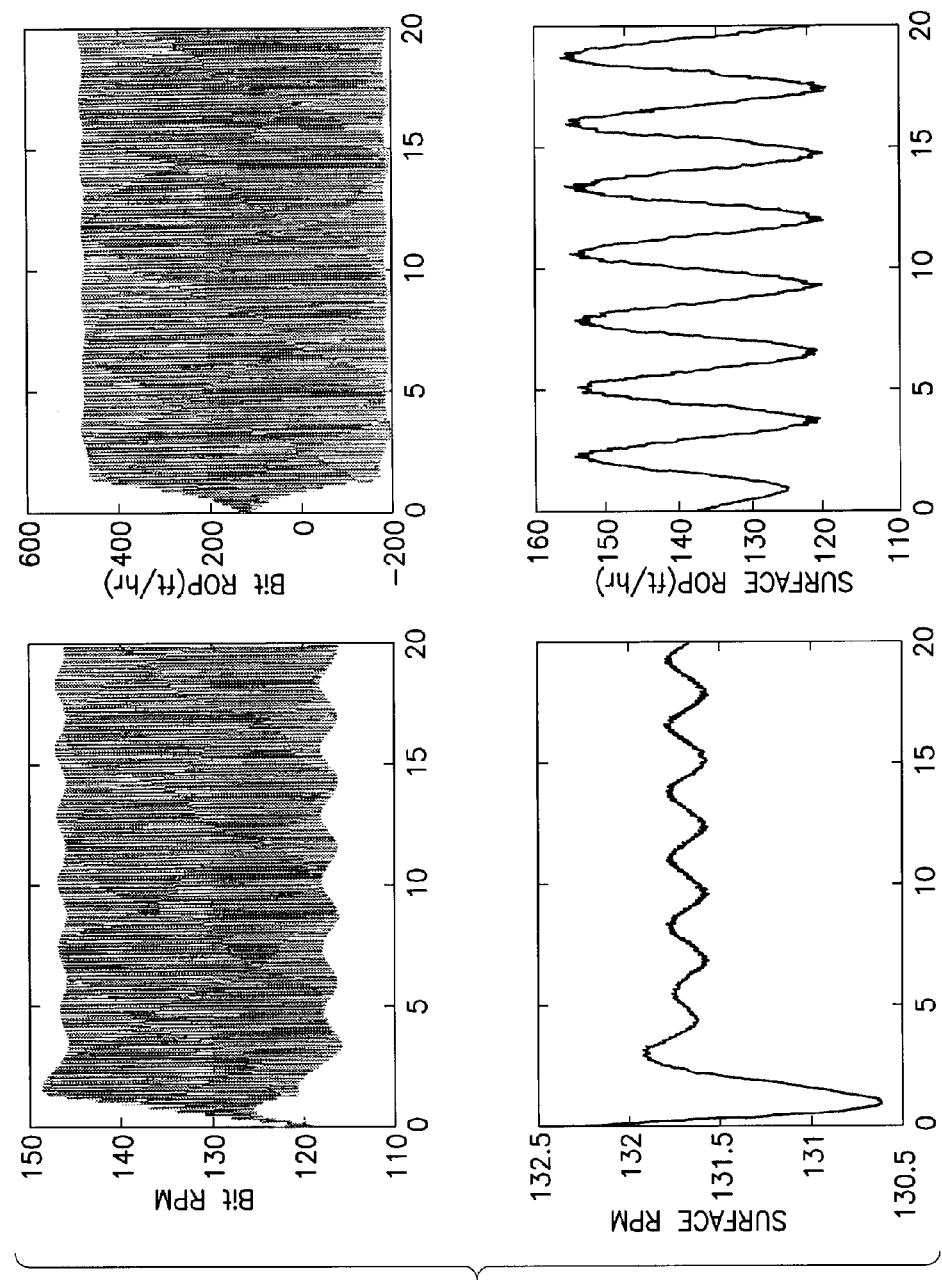
FIG. 9 is set of graphs showing time transient results of a simulation of a symmetrical six cutter drill bit.
Figure 10:
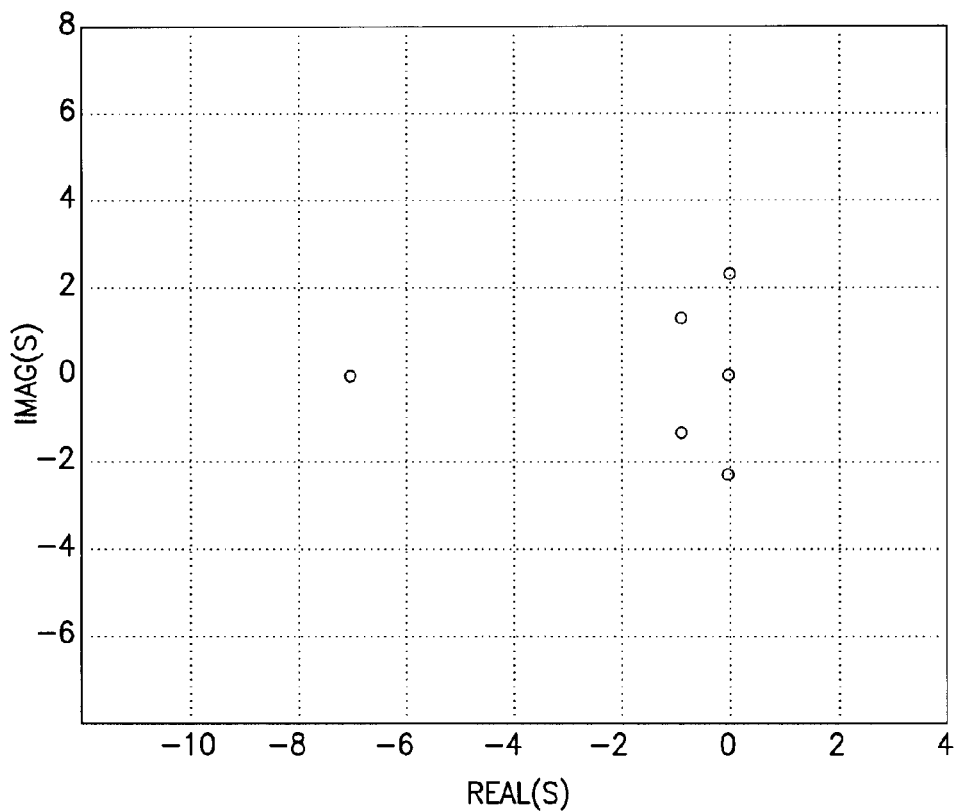
FIG. 10 is a representation of the roots of the system simulated in FIG. 9.
Figure 11:
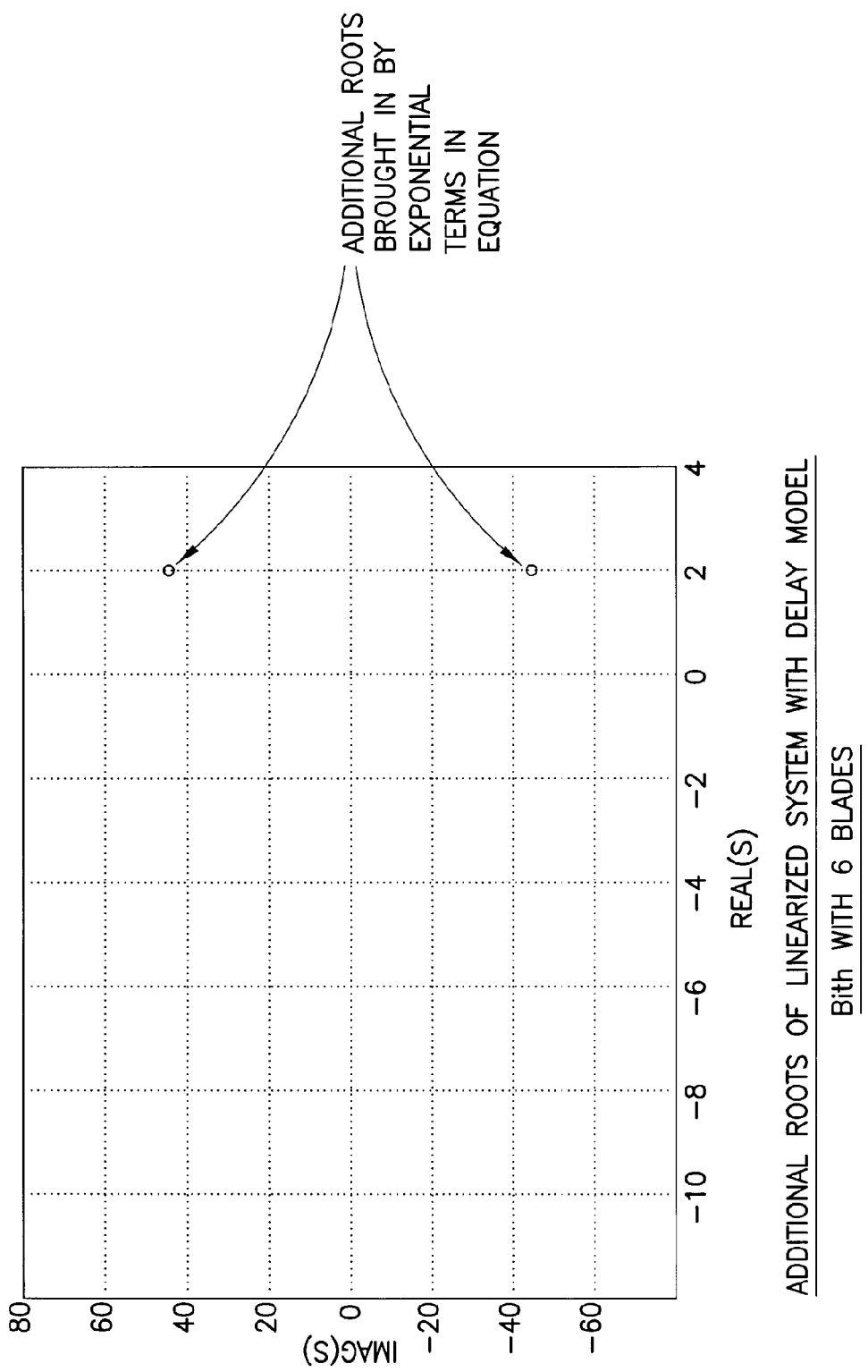
FIG. 11 is a representation of the roots of the system simulated in FIG. 9 when delay terms are introduced into the simulation.
Figure 12:
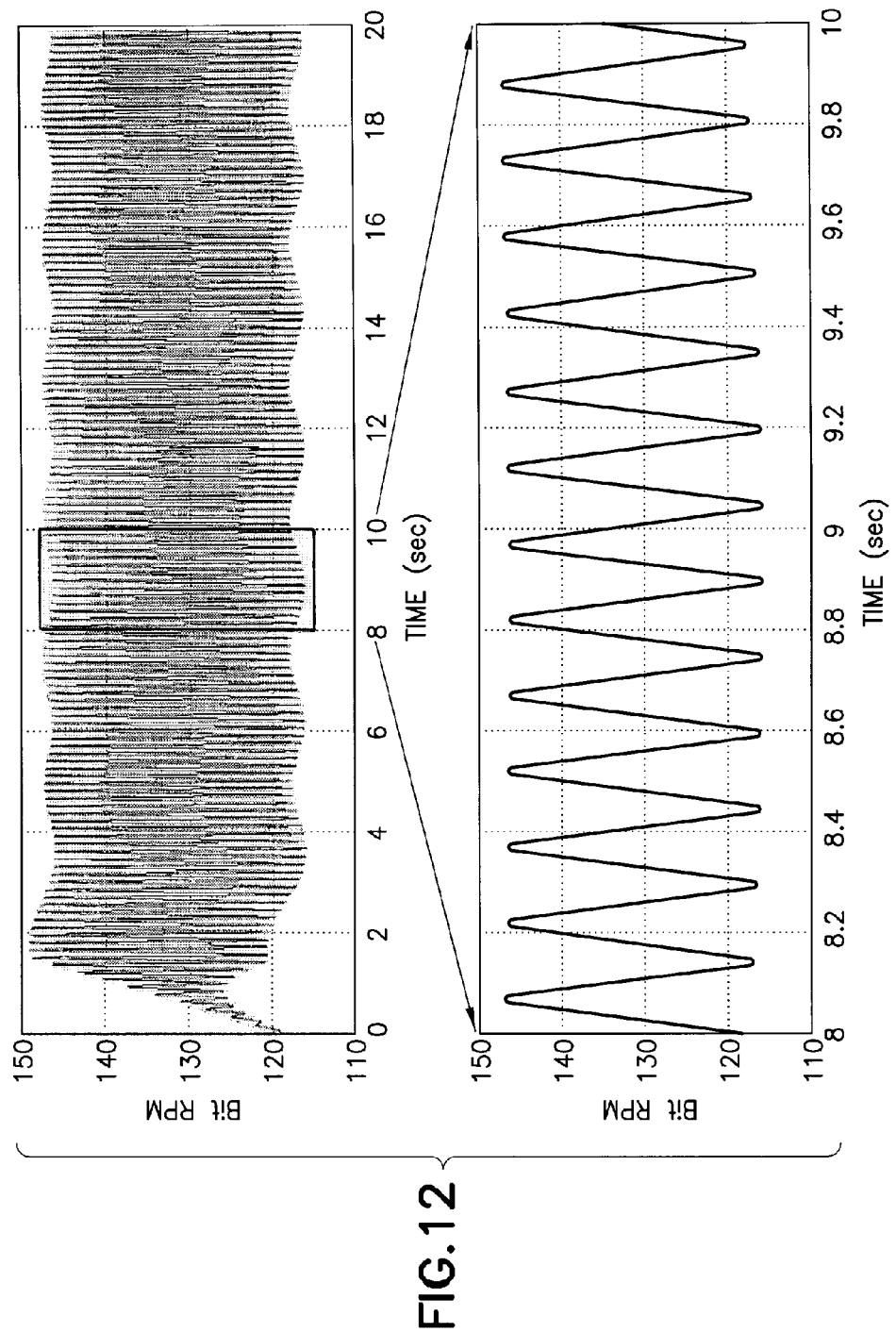
FIG. 12 is a closer view of the bit RPM versus time graph shown in FIG. 9.

In our example scenario, assuming a top force of $F_T$ of 40 KN, the above equations render the time transient simulation results shown in FIG. 9 for a bit with six symmetrically place cutting blades. FIG. 10 shows the location of the roots of the above system, when the time delay term in the expression giving the DoC is ignored. The system is shown as stable because all roots have a negative real part. However, when delay terms are introduced in the DoC expression, FIG. 11 shows that additional roots are added to the system, a pair of them in particular having a positive real part, indicating system instability. Observing the bit RPM from FIG. 9, it is shown in FIG. 12 how the frequency of the bit RPM similarly matches the frequency of the additional roots in FIG. 11.

Figure 13:
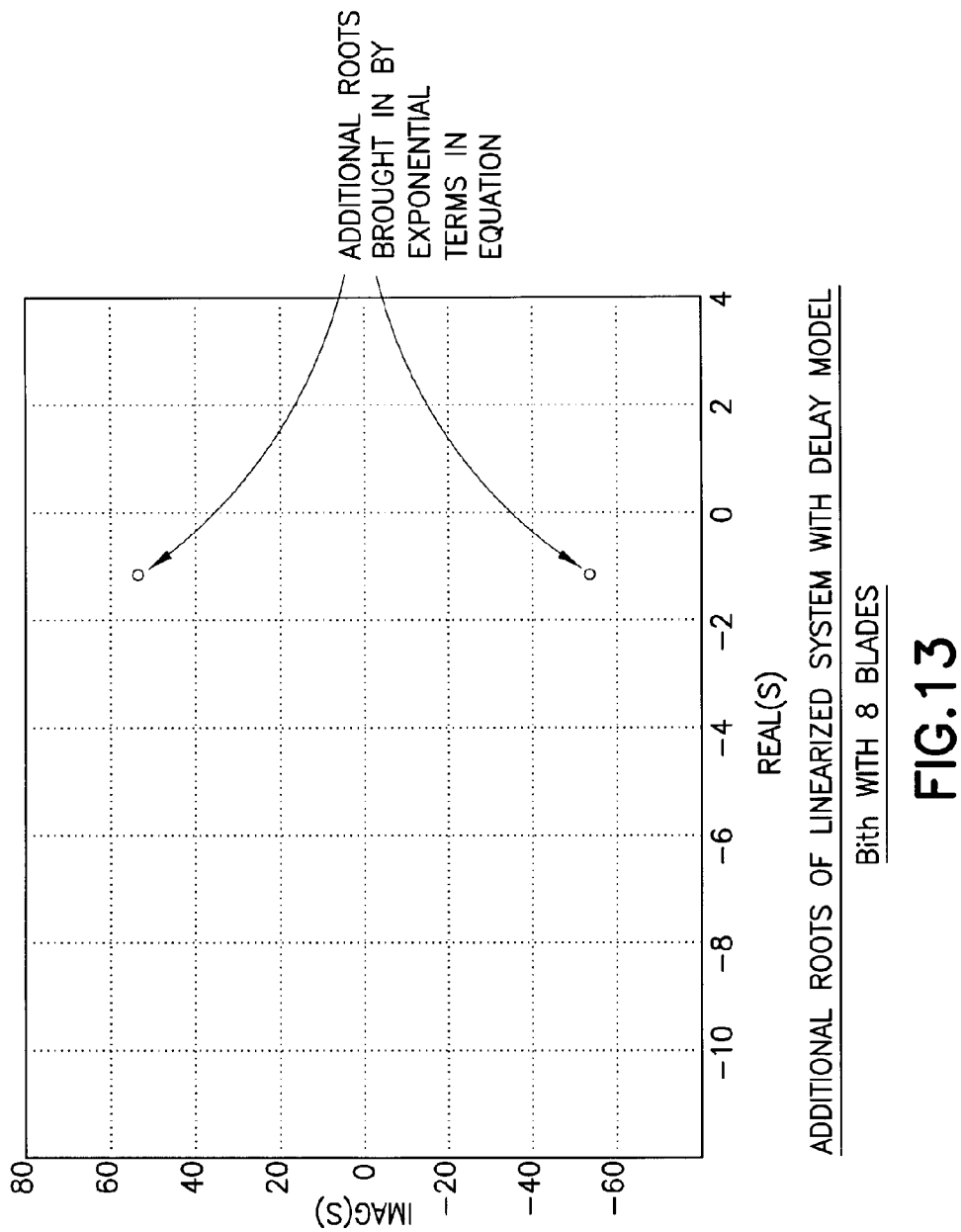
FIG. 13 is a representation of the roots of the system simulated in FIG. 9 except having a symmetrical eight cutter drill bit.
Figure 14:
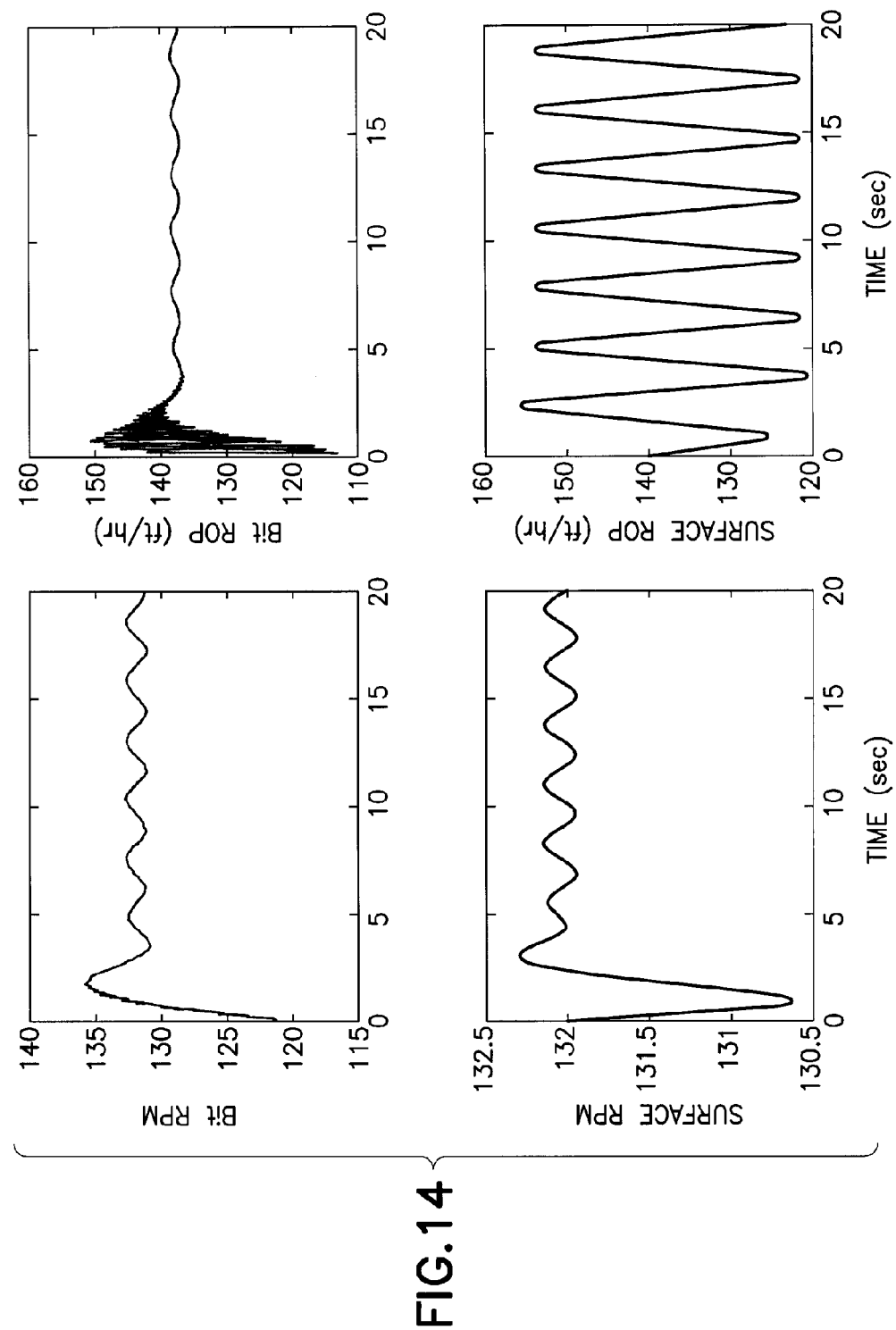
FIG. 14 is set of graphs showing time transient results of a simulation of the symmetrical six cutter drill bit of FIG. 13.

To remove this instability from the system, the number of cutting blades may be increased. Increasing the number of cutting blades from six to eight yields the results shown in FIG. 13. As can be seen in FIG. 13, all roots now have a negative real part, and the system has been stabilized. The results of a time transient simulation of the new drill bit are shown in FIG. 14.

Figure 15A:
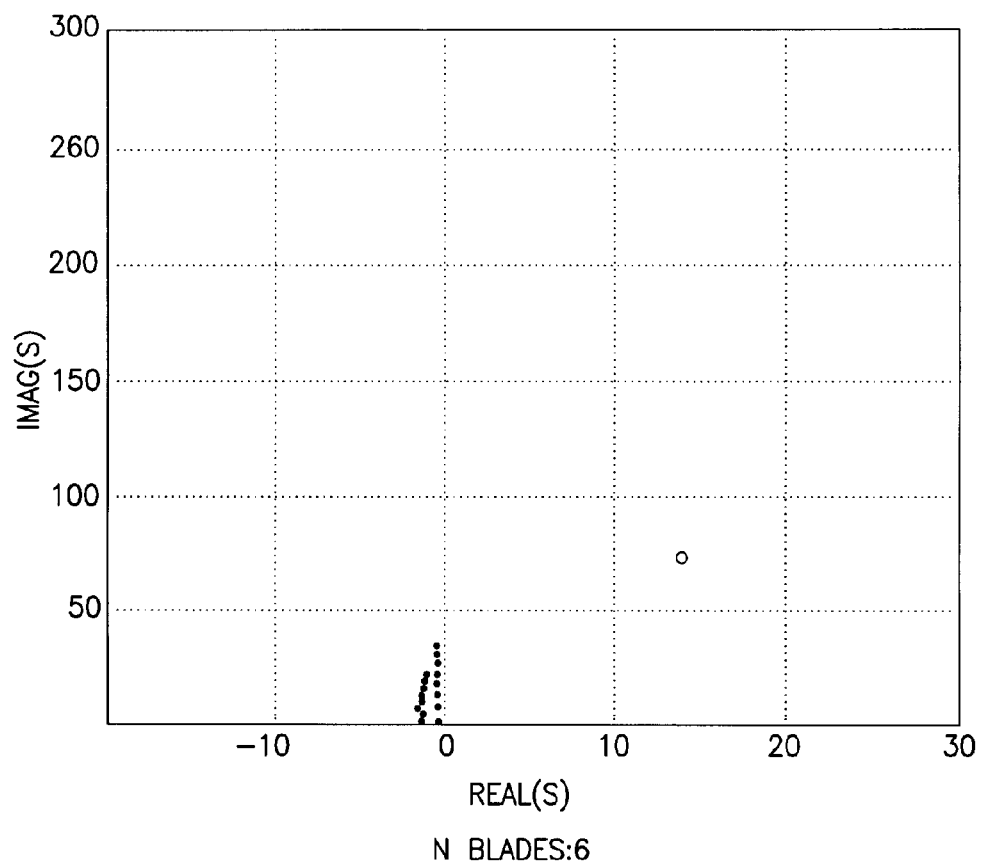
FIG. 15A is a representation of the roots of the system with difficult drilling conditions using a symmetrical six cutter drill bit.
Figure 15B:
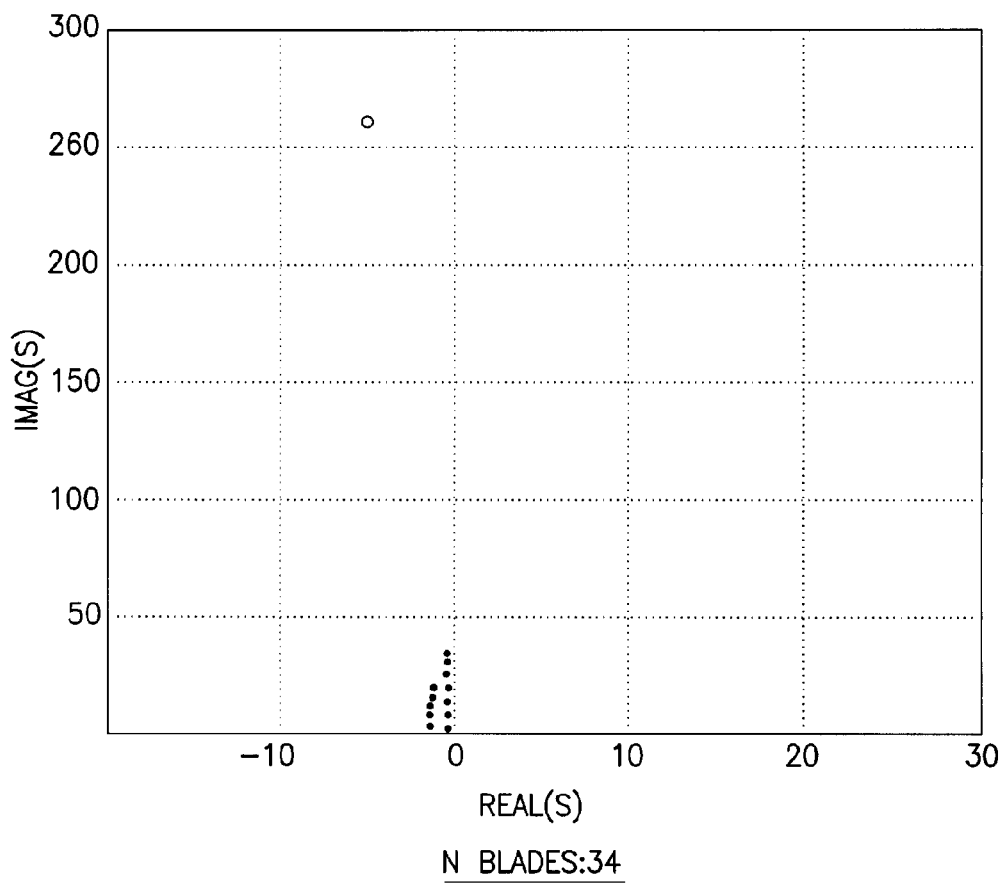
FIG. 15B is a representation of the roots of the system with difficult drilling conditions of FIG. 15A using a symmetrical thirty-four cutter drill bit.

However, increasing the number of cutting blades of a symmetrical bit drilling face is not always practical. Looking at a simulation using six cutting blades on a more difficult drilling medium (FIG. 15A), it may be determined as above that the bit may require 34 cutting blades for the drilling operation to become stabilized (FIG. 15B).

Figure 16A:
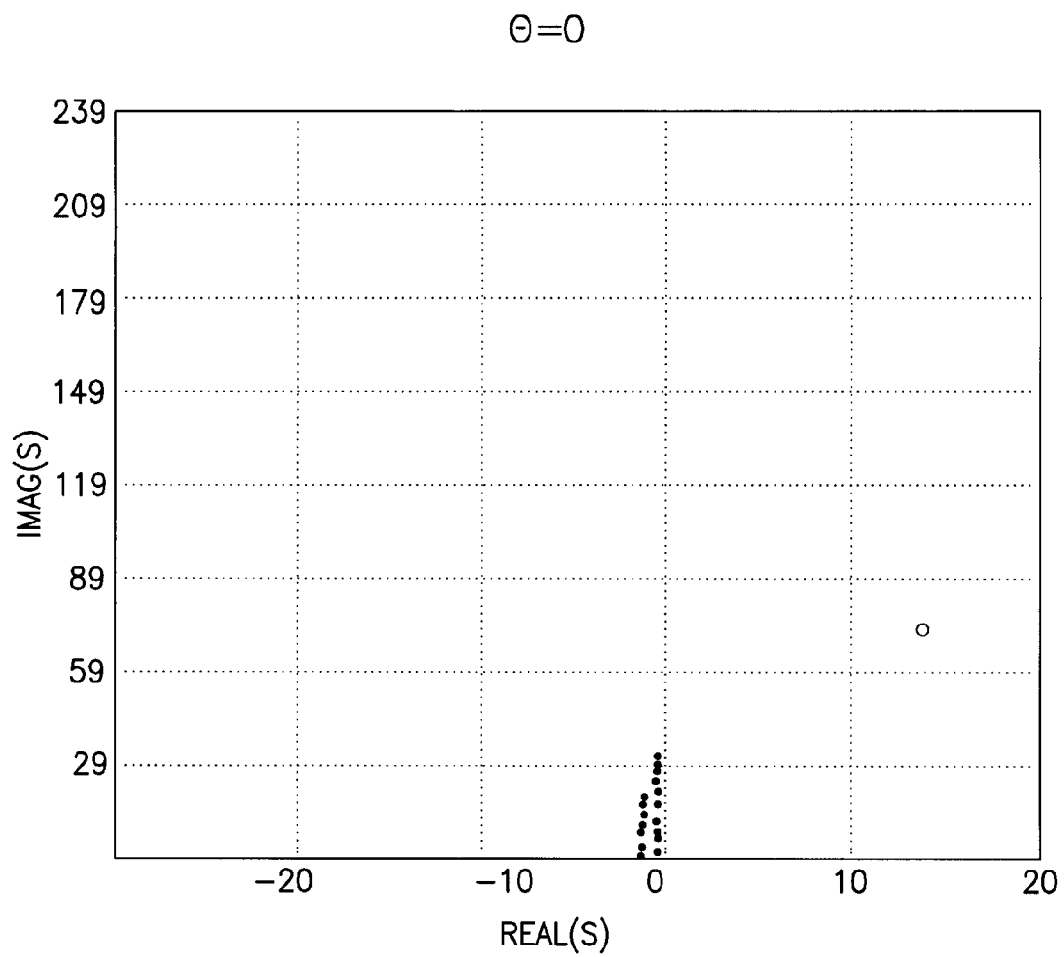
FIG. 16A is a representation of the roots of the system with difficult drilling conditions of FIG. 15A using a symmetrical six cutter drill bit having the structure of the bit shown in FIG. 1 and where θ=0.
Figure 16B:
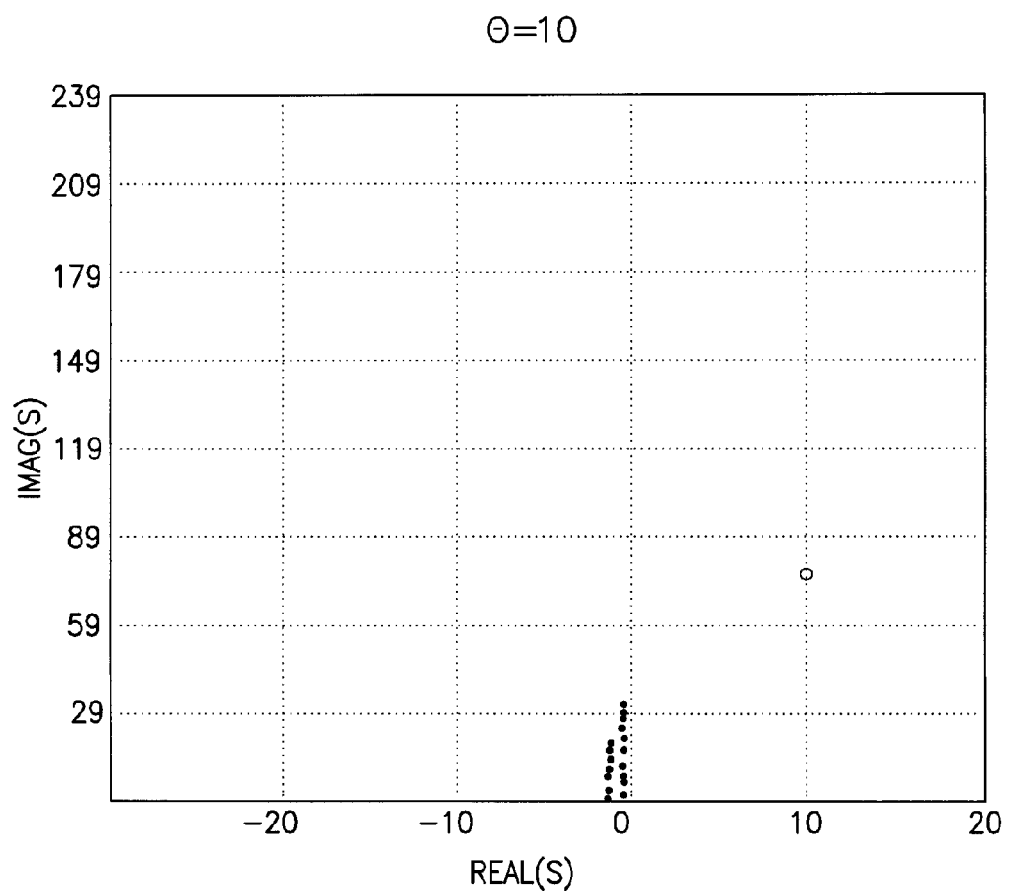
FIG. 16B is a representation of the roots of the system with difficult drilling conditions of FIG. 15A using a symmetrical six cutter drill bit having the structure of the bit shown in FIG. 1 and where θ=10.
Figure 16C:
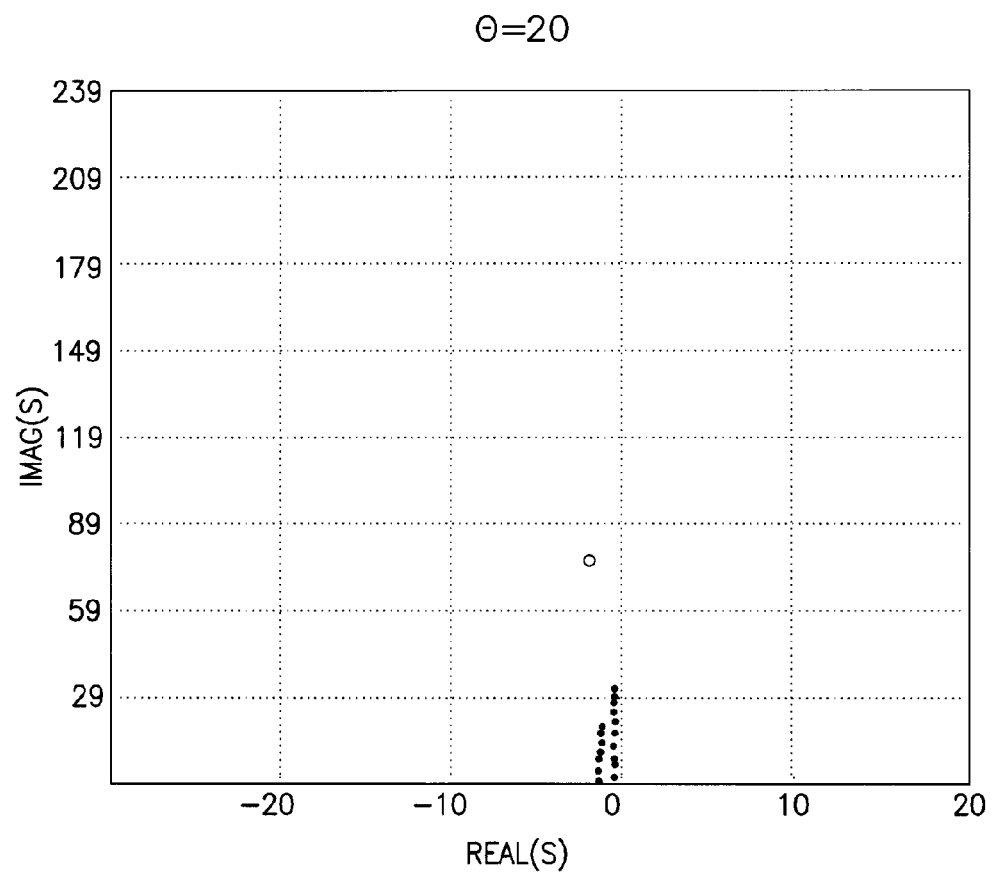
FIG. 16C is a representation of the roots of the system with difficult drilling conditions of FIG. 15A using a symmetrical six cutter drill bit having the structure of the bit shown in FIG. 1 and where θ=20.
Figure 17:
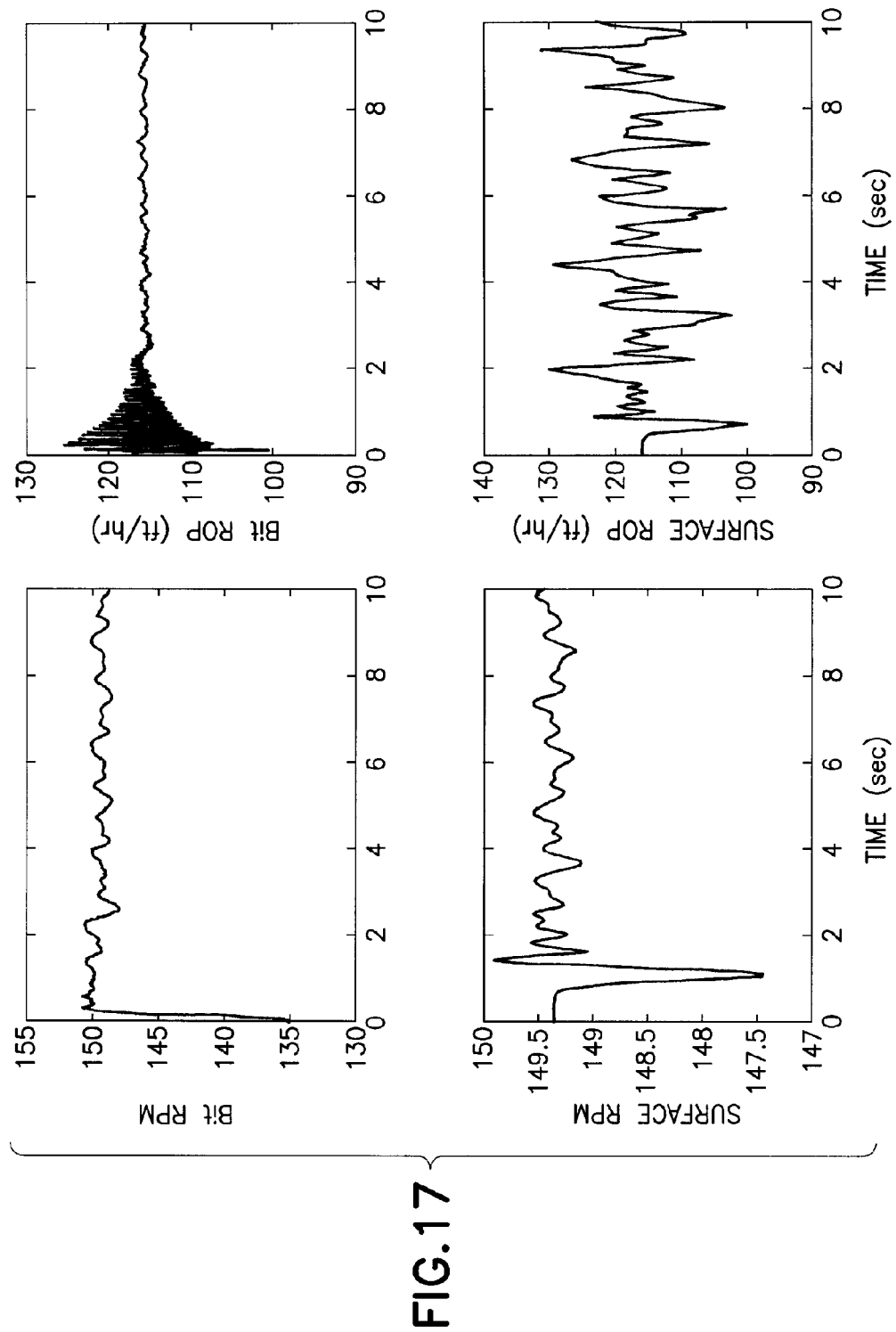
FIG. 17 is a set of graphs showing time transient results of a simulation of the asymmetrical six cutter drill bit of FIG. 16C.

Thus the symmetric distribution of cutting blades on the bit may be altered to be asymmetric, and thereby obtain stability with fewer numbers of cutting blades than symmetrical bits. Using the drill bit configuration shown in FIG. 1 with six cutting blades, FIGS. 16A-16C show the results of the above equations in altering θ. In FIG. 16A, where θ=0 degrees, there remains one pair of roots with a positive real part (only the positive side of the complex plane is presented in the figure as the negative side is the mirror image of that positive side) and therefore the drill bit is unstable. In FIG. 16B, where θ=10 degrees, there still remains one root pair with a positive real part and therefore the drill bit is unstable. However, at θ=20 degrees, all roots have a negative real part and are therefore stable. FIG. 17 shows a time transient simulation of such a drill bit, demonstrating that stick-slip instability has been at least greatly reduced.

In another embodiment of the invention, a method for designing a rotary drill bit for drilling a cavity in a medium is provided. The method may include determining a characteristic of a drillstring with which the rotary drill bit is coupled. The method may also include determining an initial number of cutting blades for the rotary drill bit, where each cutting blade includes a plurality of cutters substantially aligned along a different radius of the drilling face. The method may moreover include determining a characteristic of the medium relative to a characteristic of the cutters. The method may additionally include determining a characteristic of a rotational motion source used to rotate the rotary drill bit. The method may further include determining the angles of pitch between each of the cutting blades to minimize an amount of sticking or slipping of the rotary drill bit in the medium during a drilling operation. In some embodiments, the calculations and simulations described above may be utilized to make any one or more of the above determinations.

The invention has now been described in detail for the purposes of clarity and understanding. However, it will be appreciated that certain changes and modifications may be practiced within the scope of the appended claims. Merely by way of example, though cavities at a normal angle at the surface of a medium have been primarily discussed, the principles herein may be applied to deviated drilling operations as well.

What is claimed is:

1. A rotary drill bit for drilling a cavity in a medium, wherein the rotary drill bit comprises:
    a bit body, wherein the bit body comprises:
    a distal end having a drilling face; and
    a proximal end, having a rotational power source coupling mechanism; and
    a plurality of cutters coupled with the drilling face of the bit body, wherein the plurality of cutters comprises at least six groups of cutters, wherein each group of cutters is substantially aligned along a different radius of the drilling face; and wherein the azimuthal distribution of said groups of cutters is non-symmetric around the axis of the drilling face and wherein:
    the radius along which the second group of cutters is substantially aligned is substantially a first angle (A) in pitch from the radius along which the first group of cutters is substantially aligned;
    the radius along which the third group of cutters is substantially aligned is substantially the first angle (A) minus a second angle (θ), (A−θ), in pitch from the radius along which the second group of cutters is substantially aligned;
    the radius along which the fourth group of cutters is substantially aligned is substantially the first angle (A) plus the second angle (θ), (A+θ), in pitch from the radius along which the second group of cutters is substantially aligned;
    the radius along which the fifth group of cutters is substantially aligned is substantially the first angle (A) in pitch from the radius along which the fourth group of cutters is substantially aligned; and
    the radius along which the sixth group of cutters is substantially aligned is substantially the first angle (A)

minus two times the second angle (θ), (A−2×θ), in pitch from the radius along which the fifth group of cutters is substantially aligned, wherein the second angle θ is substantially greater than zero degree.

2. The rotary drill bit for drilling a cavity in a medium of claim 1, wherein the first angle (A) is substantially 60 degrees.

3. A rotary drill bit for drilling a cavity in a medium, wherein the rotary drill bit comprises:
- a bit body, wherein the bit body comprises:
- a distal end having a drilling face; and
- a proximal end, having a rotational power source coupling mechanism; and
- a plurality of cutters coupled with the drilling face of the bit body, wherein the plurality of cutter comprises at least eight groups of cutters and wherein:
- the radius along which the second group of cutters is substantially aligned is substantially a first angle (A) in pitch from the radius along which the first group of cutters is substantially aligned;
- the radius along which the third group of cutters is substantially aligned is substantially the first angle (A) minus a second angle (θ), (A−θ), in pitch from the radius along which the second group of cutters is substantially aligned;
- the radius along which the fourth group of cutters is substantially aligned is substantially the first angle (A) in pitch from the radius along which the third group of cutters is substantially aligned;
- the radius along which the fifth group of cutters is substantially aligned is substantially the first angle (A) plus the second angle (θ), (A+θ) in pitch from the radius along which the fourth group of cutters is substantially aligned; and
- the radius along which the sixth group of cutters is substantially aligned is substantially the first angle (A) in pitch from the radius along which the fifth group of cutters is substantially aligned;
- the radius along which the seventh group of cutters is substantially aligned is substantially the first angle (A) minus two times the second angle (θ), (A−2×θ), in pitch from the radius along which the sixth group of cutters is substantially aligned;
- the radius along which the eighth group of cutters is substantially aligned is substantially the first angle (A) in pitch from the radius along which the seventh group of cutters is substantially aligned, wherein the second angle θ is substantially greater than zero degree.

4. The rotary drill bit for drilling a cavity in a medium of claim 3, wherein the first angle (A) is substantially 45 degrees.

5. The rotary drill bit for drilling a cavity in a medium of claim 1 or 4, wherein the second angle θ is determined in an iterative manner based at least in part on at least one selection from a group consisting of:
- the characteristics of a bottom hole assembly ("BHA") coupled with the bit body;
- the characteristics of a lengthwise element coupling the BHA with a rotational motion source;
- the characteristics of the interaction between the rotary drill bit and the medium; and
- the characteristics of the rotational motion source.

6. The rotary drill bit for drilling a cavity in a medium of claim 5, wherein the characteristics of the bottom hole assembly ("BHA") include a characteristic selected from a group consisting of:
- a mass;
- a rotational inertia;
- an axial drag coefficient; and
- a rotational drag coefficient.

7. The rotary drill bit for drilling a cavity in a medium of claim 5, wherein the characteristics of the lengthwise element include a characteristic selected from a group consisting of:
- a mass;
- a rotational inertia;
- an extensional spring constant;
- a rotational spring constant;
- an axial drag coefficient;
- a rotational drag coefficient; and
- a length.

8. The rotary drill bit for drilling a cavity in a medium of claim 5, wherein the characteristics of the interaction between the rotary drill bit and the medium include a characteristic selected from a group consisting of:
- a reaction force at the bit; and
- a reaction torque at the bit.

9. The rotary drill bit for drilling a cavity in a medium of claim 5, wherein the characteristics of the rotational motion source include a characteristic selected from a group consisting of:
- a longitudinal force;
- a drive torque;
- a stall torque; and
- a maximum rotation speed.

10. The rotary drill bit for drilling a cavity in a medium of claim 1 or 4, wherein the second angle θ is selected to maximize a rate of progress of the rotary drill bit in the medium.

11. The rotary drill bit for drilling a cavity in a medium of claim 1 or 4, wherein the second angle θ is selected to minimize a sticking or a slipping of the rotary drill bit in the medium during a drilling operation.

12. The rotary drill bit for drilling a cavity in a medium of claim 1 or 4, wherein the second angle θ is 20 degrees.

13. The rotary drill bit for drilling a cavity in a medium of claim 1, wherein the cavity is at least partially deviated from a normal angle at a surface of the medium.

* * * * *